United States Patent [19]

Schuelke et al.

[11] Patent Number: 5,757,215
[45] Date of Patent: May 26, 1998

[54] COMMON-GATE PRE-DRIVER FOR DISC DRIVE WRITE CIRCUIT

[75] Inventors: Robert John Schuelke, Lakeville; John Anthony Schuler, Maplewood; Douglas Warren Dean, Eagan, all of Minn.

[73] Assignee: VTC Inc., Bloomington, Minn.

[21] Appl. No.: 814,002

[22] Filed: Mar. 10, 1997

[51] Int. Cl.$^6$ ................................. H03K 3/01; H03K 1/02
[52] U.S. Cl. .................... 327/110; 327/478; 327/588; 360/46; 360/68
[58] Field of Search ........................... 327/110, 108, 327/478, 309, 327, 427, 588; 360/46, 67, 68

[56] References Cited

U.S. PATENT DOCUMENTS

| | | | |
|---|---|---|---|
| 5,280,196 | 1/1994 | Shinozaki | 307/270 |
| 5,296,975 | 3/1994 | Contreras et al. | 360/46 |
| 5,333,081 | 7/1994 | Mitsui | 327/110 |
| 5,539,342 | 7/1996 | Gersbach et al. | 327/110 |
| 5,550,502 | 8/1996 | Aranovsky | 327/110 |
| 5,638,012 | 6/1997 | Hashimoto et al. | 327/110 |

*Primary Examiner*—Son T. Dinh
*Attorney, Agent, or Firm*—Kinney & Lange, P.A.

[57] ABSTRACT

An apparatus conducts current through a two terminal inductive load. The apparatus has a first conduction path, from a first supply voltage to one terminal of the inductive load and a second conduction path from the second terminal of the inductive load to a second supply voltage. The first conduction path includes a switching device that is controlled by a field-effect transistor having a gate terminal, second terminal, and third terminal. The gate terminal of the field-effect transistor is coupled to a reference voltage. The voltage at the second terminal of the field-effect transistor increases when the voltage at the field-effect transistor's third terminal increases.

20 Claims, 3 Drawing Sheets

COMMON-GATE PRE-DRIVER FOR DISC DRIVE WRITE CIRCUIT

BACKGROUND OF THE INVENTION

The present invention relates to a write circuit for an inductive transducer in a magnetic data storage device. In particular, the present invention pertains to a write circuit with an improved pre-driver stage that reduces switching time while avoiding transistor breakdown.

The present invention is typically used to store information on a magnetic disc in a magnetic disc drive. The information is stored on the disc by creating a series of small magnetic domains within the disc. The small magnetic domains are formed by passing an inductive transducer near the surface of the disc while the inductive transducer creates a magnetic field. As the transducer passes over an area of the disc, the magnetic moment of that area aligns to the direction of the transducer's magnetic field. This alignment forms the magnetic domain, which is defined at its boundaries by a change in the direction of the disc's magnetic moment. Changes in the direction of the disc's magnetic moment are created by changing the direction of the magnetic field generated by the transducer as it passes over the disc.

The magnetic field generated by the transducer is produced by passing current through an inductive load. The direction of the current passing through the inductive load determines the direction of the magnetic field. Thus, reversing the direction of the current through the inductive load reverses the direction of the magnetic field.

The direction of the current passing through the inductive load is controlled by a write circuit. Typically the write circuit is configured as an H-switch that contains two pairs of switches; a lower pair of switches and on upper pair of switches. By simultaneously activating one switch in each pair, the write circuit can direct current in a first direction through the inductive load. By deactivating these two switches and activating the other two switches, one from each pair, the write circuit can direct current in an opposite direction through the inductive load.

Typically, the two lower switches are directly activated and deactivated in a complimentary manner by two complimentary input signals. The two input signals also indirectly activate and deactivate the upper switches through a pre-driver stage. The speed with which the complimentary input signals and the pre-driver stage cause the switches of the H-switch to change states partially determines the performance of the write circuit. Specifically, the speed of the switching partially determines the rate at which data may be written to the disc.

FIG. 1 shows a write circuit of the prior art which includes an H-switch constructed from transistors $Q_1$, $Q_2$, $Q_3$, $Q_4$, inductor L, and current source $I_W$. Transistor $Q_1$ has its collector connected to upper power supply $V_{CC}$ and its emitter connected to the collector of transistor $Q_3$ and one terminal of inductor L. Transistor $Q_2$ has its collector connected to upper power supply $V_{CC}$ and its emitter connected to the collector of transistor $Q_4$ and the other terminal of inductor L. The emitters of transistors $Q_3$ and $Q_4$ are connected together and to current source $I_W$, which is further connected to lower power supply $V_{EE}$. Transistors $Q_1$ and $Q_2$ form an upper pair of switches and transistors $Q_3$ and $Q_4$ form a lower pair of switches. When transistors $Q_1$ and $Q_4$ are active, current is conducted through inductor L in a first direction and when transistors $Q_2$ and $Q_3$ are active, current is conducted in a second direction through inductor L.

The bases of transistors $Q_1$ and $Q_2$ are connected to a pre-driver stage that activates and deactivates the two transistors in a complimentary manner. The portion of the pre-driver stage connected to the base of transistor $Q_1$ is an inverter constructed from P-channel Metal-Oxide-Semiconductor Field-Effect Transistor (MOSFET) $M_2$ and N-channel MOSFET $M_1$. The source of MOSFET $M_2$ is connected to upper power supply $V_{CC}$ and the source of MOSFET $M_1$ is connected to lower power supply $V_{EE}$. The gates of MOSFETs $M_1$ and $M_2$ are connected together to form an inverter input that is indirectly connected to an input node $V_Y$ through level shifter $LS_1$. The level shifter enhances the signal on input node $V_Y$ so that the enhanced signal can control the MOSFETs. The drains of MOSFETs $M_1$ and $M_2$ are connected together to form an inverter output that is connected to the base of transistor $Q_1$.

Similarly, P-channel MOSFET $M_4$ and N-channel MOSFET $M_3$ are configured as an inverter at the base of transistor $Q_2$. The source of MOSFET $M_4$ is connected to upper power supply $V_{CC}$ and the source of MOSFET $M_3$ is connected to lower power supply $V_{EE}$. The drains of MOSFETs $M_3$ and $M_4$ are connected together to form an inverter output that is connected to the base of transistor $Q_2$. The gates of MOSFETs $M_3$ and $M_4$ are connected together to form an inverter input, which is connected to a second input node $V_X$ through level shifter $LS_2$. The level shifter enhances the signal on input node $V_X$ so that the enhanced signal can control the MOSFETs.

In operation, when the signal on input node $V_Y$ is high, the signal on input node $V_X$ is low, transistor $Q_3$ is active and transistor $Q_4$ is inactive. Thus, transistor $Q_4$ does not conduct current and transistor $Q_3$ conducts nearly all of the current from current source $I_W$. The high value at input node $V_Y$ raises the voltage at the gates of MOSFETs $M_1$ and $M_2$ and causes MOSFET $M_2$ to act as a high impedance between upper power supply $V_{CC}$ and the base of transistor $Q_1$. The high value at input node $V_Y$ also causes MOSFET $M_1$ to act as a low impedance element between lower power supply $V_{EE}$ and the base of transistor $Q_1$. Thus, the base of transistor $Q_1$ is essentially reduced to the voltage of lower power supply $V_{EE}$, deactivating transistor $Q_1$.

The low value at input node $V_X$ lowers the voltage at the gates of MOSFETs $M_3$ and $M_4$ and causes N-channel MOSFET $M_3$ to act as a high impedance between lower power supply $V_{EE}$ and the base of transistor $Q_2$. The low value at $V_X$ also causes P-channel MOSFET $M_4$ to act as a low impedance between upper power supply $V_{CC}$ and the base of transistor $Q_2$. This raises the voltage at the base of transistor $Q_2$ to nearly the voltage of upper power supply $V_{CC}$ and thereby activates transistor $Q_2$.

Thus, with $V_Y$ high and $V_X$ low, transistors $Q_1$ and $Q_4$ are inactive and do not conduct current and transistors $Q_2$ and $Q_3$ are active and conduct nearly all of the current of current source $I_W$.

If the input values are reversed with $V_Y$ low and $V_X$ high, transistors $Q_1$ and $Q_4$ conduct current $I_W$ and transistors $Q_2$ and $Q_3$ are inactive. Thus, the direction of the current flowing through inductor L is reversed when the input values are reversed.

The MOSFETs of FIG. 1 have several characteristics that make them desirable as pre-driver transistors. In particular, MOSFETs are able to pull the bases of the upper switching transistors to nearly $V_{CC}$ and thereby are able to maximize the amount of swing for a given voltage difference between the power supplies. However, the MOSFETs also limit the write circuit of FIG. 1 because they have a breakdown voltage that limits the voltage difference between the power supplies. Specifically, when input $V_Y$ is high, the base of transistor $Q_1$ has its voltage lowered to essentially the voltage of lower power supply $V_{EE}$. In this state, MOSFET $M_2$ sees a source-to-drain voltage equal to $V_{CC}$ minus $V_{EE}$. If this voltage difference exceeds the source-to-drain breakdown voltage of the MOSFET, the MOSFET will "burn out" and the write circuit will be destroyed. Thus, the two power supply voltages must be chosen so that the difference between the voltages is less than the MOSFET breakdown voltage.

By limiting the difference between the supply voltages, the MOSFET breakdown voltage indirectly limits the voltage across the inductor during switching. This inductor voltage, known as swing, determines the switching time of the inductor because the rate of change of current in the inductor is equal to the voltage across the inductor divided by the inductance. Thus, by limiting the voltage difference between the power supplies, the MOSFET breakdown voltage indirectly limits the switching speed of the write circuit.

To avoid limiting the switching speed of the inductor, the MOSFET breakdown voltages may be increased so that a larger voltage difference between the power supplies does not cause MOSFET breakdown. However, if a MOSFET's breakdown voltage is increased, its switching speed will deteriorate. The reason for this deterioration is that a MOSFET's breakdown voltage is proportional to the gate length, and it is the gate length that determines the switching speed. The shorter the gate length, the lower the corresponding breakdown voltage.

Therefore, if MOSFETs are to be used in the prior art write circuits, either the switching speed of the MOSFET or the switching speed of the inductor must be sacrificed to accommodate the breakdown voltages of the MOSFETs.

SUMMARY OF THE INVENTION

The present invention is an apparatus for conducting current through a two terminal inductive load. The apparatus has a first conduction path from a power supply to one end of the inductive load. This first conduction path includes a switching device used to control the current along the first conduction path. The apparatus also has a second conduction path extending from a second end of the inductive load to a second supply voltage. The apparatus further contains a field-effect transistor having a gate terminal coupled to a reference voltage, a second terminal coupled to a node having a time varying voltage, and a third terminal coupled to the switching device of the first conduction path. The voltage at the third terminal of the field-effect transistor is capable of increasing when the voltage at the second terminal of the field-effect transistor increases.

Since the voltages at the second and third terminals of the field-effect transistor track each other, the voltage difference between these two terminals is kept small and relatively independent of the voltage difference between the two power supplies. In a typical embodiment, where the field-effect transistor is a P-channel MOSFET with its gate coupled to the reference voltage, its source coupled to the time varying voltage node, and its drain coupled to the switching device, the fact that the second and third terminals track each other means that the source-to-drain breakdown voltage of the MOSFET does not significantly affect the choice of power supply voltages.

In some embodiments of the present invention, the time varying voltage at the second terminal of the field effect transistor is created by an inverter. The inverter is preferably constructed from a P-channel MOSFET and an N-channel MOSFET, with the drains of the MOSFETs coupled to the source of the common-gate MOSFET and the gates of the inverter MOSFETs connected together to form an inverter input. The source of the inverter's P-channel MOSFET is connected to the first power supply voltage, and the source of the inverter's N-channel MOSFET is connected to the reference voltage.

In such embodiments, the inverter and the common-gate MOSFET provide two distinct voltage-impedance states. In one state, the inverter input is low, causing a high source-to-drain impedance in the inverter's N-channel MOSFET and a low source-to-drain impedance in the inverter's P-channel MOSFET. Because of the P-channel MOSFETs low impedance, the output of the inverter is essentially at the first power supply voltage, meaning that the source of the common-gate MOSFET is at the first power supply voltage. This causes the P-channel common-gate MOSFET to have a low source-to-drain impedance and thereby completes a high-conductivity/low-impedance path between the switching device and the first power supply voltage. This state quickly raises the base of the switching device to the first supply voltage. The low impedance is significant since it allows the base voltage to be raised close to the first supply voltage.

In the second voltage-impedance state, the input to the inverter is high, the inverter's P-channel MOSFET has a high source-to-drain impedance, and the inverter's N-channel MOSFET has a low source-to-drain impedance to the reference voltage. Thus, with the inverter input high, the source of the common-gate MOSFET is essentially at the reference voltage. Since this is the same voltage as the voltage at the gate of the common-gate MOSFET, the common-gate MOSFET has a high source-to-drain impedance. This means that the switching device is coupled to the reference voltage through a high-impedance/low-conductivity path. This state can be used to quickly lower the voltage at the base of the switching device by discharging all of the capacitance at the base's node. This will lower the voltage at the base of the switching device to a value below the reference voltage.

It is preferred in the second state described above that the voltage at the base of the switching device be prevented from coming too close to the second power supply voltage since such voltages can cause other elements in the invention to saturate. Preferably, this is accomplished using a P-N junction, such as a diode, and a saturation reference voltage. The P-N junction is connected between the saturation reference voltage and the base of the switching device so that when the common-gate MOSFET has a high source-to-drain impedance, the voltage at the base of the switching device only differs from the saturation reference voltage by the forward-bias voltage across the P-N junction. The saturation reference voltage is preferably chosen to be as close to the second power supply voltage as possible without causing saturation of other elements in the circuit.

When the present invention is used as part of an H-switch, the swing of the inductor is dependent on the voltage difference between the first power supply voltage and the saturation reference voltage. It is not necessarily dependent on the maximum voltage seen by the inverter's MOSFETs, which is the voltage difference between the first power supply voltage and the common-gate reference voltage. The fact that the swing voltage is not dependent on the maximum voltage seen by the inverter means that the swing voltage is not limited by the source-to-drain breakdown voltage of the inverter's MOSFETs. As such, in the present invention, the swing voltage may be greater than the breakdown voltage of the MOSFETs.

Since the present invention separates the breakdown voltages of the inverter's MOSFETs from the swing of the inductive transducer, it can use the MOSFETs ability to raise the base of the switching device close to the first supply voltage without significantly restricting the value of the second supply voltage.

DETAILED DESCRIPTION OF THE PREFERRED EMBODIMENTS

Figure 1:
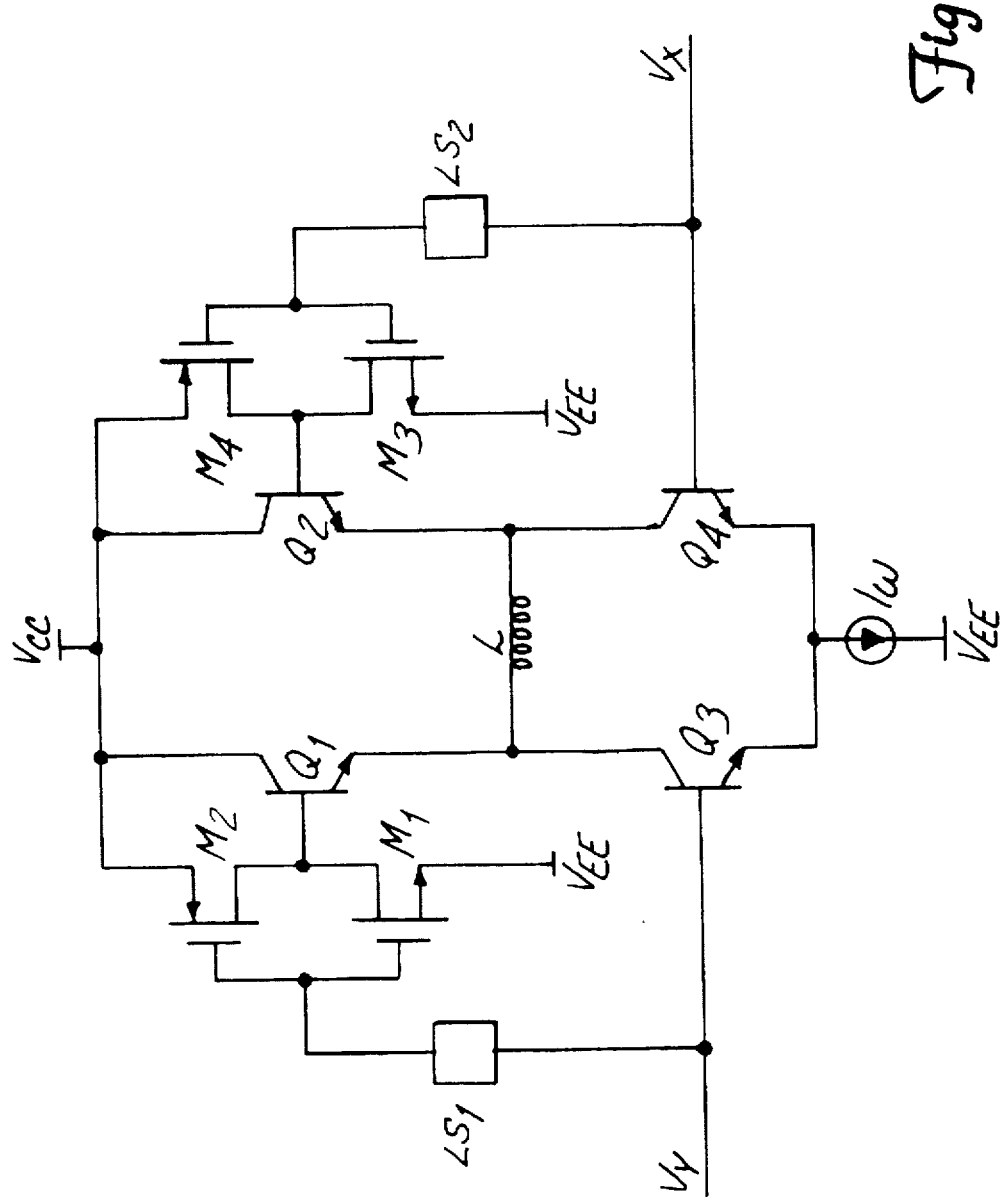
FIG. 1 is a diagram of a prior art write circuit.
Figure 2:
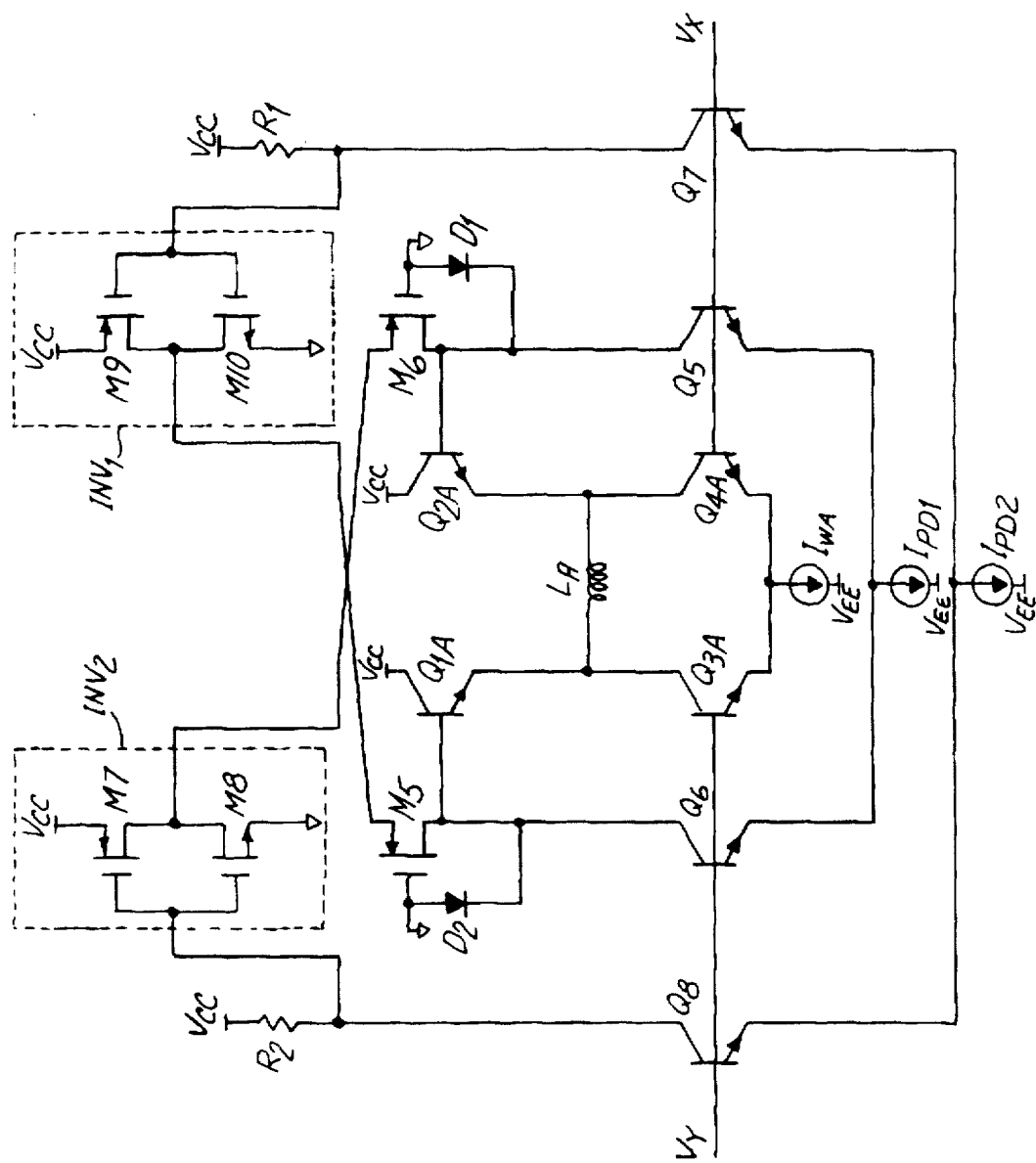
FIG. 2 is a diagram of a write circuit according to the present invention.

FIG. 2 is a circuit diagram of one embodiment of the present invention. The current through an inductor $L_A$ is controlled by an H-switch constructed from four transistors, $Q_{1A}$, $Q_{2A}$, $Q_{3A}$, and $Q_{4A}$, as well as current source $I_{WA}$. Transistor $Q_{1A}$ has its collector connected to an upper power supply voltage $V_{CC}$ and its emitter connected to one terminal of inductor $L_A$. Transistor $Q_{2A}$ has its collector connected to upper power supply voltage $V_{CC}$ and its emitter connected to a second terminal of inductor $L_A$. The collectors of transistors $Q_{3A}$ and $Q_{4A}$ are connected to the emitters of transistors $Q_{1A}$ and $Q_{2A}$, respectively. The emitters of transistors $Q_{3A}$ and $Q_{4A}$ are connected together and to current source $I_{WA}$, which is connected between these emitters and lower power supply voltage $V_{EE}$.

The H-switch, which forms a driver or switching stage, is connected to a first pre-driver stage constructed from BJT transistors $Q_5$ and $Q_6$, P-channel MOSFETs $M_5$ and $M_6$, and diodes $D_1$ and $D_2$. The bases of transistors $Q_{1A}$ and $Q_{2A}$ are connected to the drains of MOSFETs $M_5$ and $M_6$, respectively. The drain of MOSFET $M_5$ is further connected to the collector of transistor $Q_6$ and to the cathode of diode $D_2$. The gate of MOSFET $M_5$ is connected to a reference voltage, which has a value between upper power supply voltage $V_{CC}$ and lower power supply voltage $V_{EE}$, and is typically at ground. Since MOSFET $M_5$ has its gate connected to a reference voltage, it is known as a common-gate MOSFET. Transistor $Q_6$ has its base connected to the base of transistor $Q_{3A}$ and its emitter connected to current source $I_{PD1}$. The anode of diode $D_2$ is connected to the same reference voltage that is connected to the gate of MOSFET $M_5$. Although diode $D_2$'s connection to this reference voltage is preferred, it is not necessary, and the diode could be connected to a separate voltage. In general, the reference voltage connected to the anode of diode $D_2$ is known as the saturation reference voltage for reasons discussed further below.

The base of transistor $Q_{2A}$ is connected to the drain of MOSFET $M_6$, which has its gate connected to the same reference voltage as the gate of MOSFET $M_5$, making MOSFET $M_6$ a common-gate MOSFET like MOSFET $M_5$. The drain of MOSFET $M_6$ is connected to the collector of transistor $Q_5$ and the cathode of diode $D_1$. The anode of diode $D_1$ is connected to the same reference voltage that is connected to the gate of MOSFET $M_5$. However, this is not necessary. The anode could be connected to a separate saturation reference voltage as long as the anode is connected to the same voltage connected to the anode of diode $D_2$. The base of transistor $Q_5$ is connected to the base of transistor $Q_{4A}$, and the emitter of transistor $Q_5$ is connected to current source $I_{PD1}$, which has a second terminal connected to lower power supply voltage $V_{EE}$.

The pre-driver stage described above is further connected to a second pre-driver stage constructed from inverters $INV_1$ and $INV_2$, resistors $R_1$ and $R_2$, and transistors $Q_7$ and $Q_8$.

The outputs of inverters $INV_1$ and $INV_2$ are connected to the sources of MOSFETs $M_5$ and $M_6$, respectively. The input to inverter $INV_1$ is connected to one terminal of resistor $R_1$ and the collector of transistor $Q_7$. The other terminal of resistor $R_1$ is connected to upper power supply voltage $V_{CC}$. The input to inverter $INV_2$ is connected to resistor $R_2$ and the collector of transistor $Q_8$. The other terminal of resistor $R_2$ is connected to upper power supply voltage $V_{CC}$. The emitters of transistors $Q_7$ and $Q_8$ are connected together at one terminal of current source $I_{PD2}$, which has a second terminal connected to lower power supply voltage $V_{EE}$. The base of transistor $Q_7$ is connected to the bases of transistors $Q_5$ and $Q_{4A}$, forming an input node $V_X$. Similarly, the base of transistor $Q_8$ is connected to the bases of transistors $Q_6$ and $Q_{3A}$, forming an input node $V_Y$.

Inverter $INV_1$ is composed of P-channel MOSFET $M_9$ and N-channel MOSFET $M_{10}$. The gates and drains of MOSFETs $M_9$ and $M_{10}$ are connected together forming an inverter input and inverter output, respectively. The source of MOSFET $M_9$ is connected to upper power supply voltage $V_{CC}$ and the source MOSFET $M_{10}$ is connected to the same reference voltage connected to the gates of common-gate MOSFETs $M_5$ and $M_6$. Inverter $INV_2$ is composed of P-channel MOSFET $M_7$ and N-channel MOSFET $M_8$. The gates and drains of MOSFETs $M_7$ and $M_8$ are connected together forming an inverter input and inverter output, respectively. The source of MOSFET $M_7$ is connected to upper power supply voltage $V_{CC}$, and the source of MOSFET $M_8$ is connected to the same reference voltage connected to the gates of common-gate MOSFETs $M_5$ and $M_6$.

In operation, when input $V_Y$ is high relative to input $V_X$, transistor $Q_8$ conducts nearly all the current created by current source $I_{PD2}$ and transistor $Q_7$ does not conduct current. The collector current of transistor $Q_8$ is drawn through resistor $R_2$ and causes a voltage drop across resistor $R_2$, resulting in a low voltage at the input to inverter $INV_2$. When the input to inverter $INV_2$ is low, MOSFET $M_8$ is inactive and creates a high impedance to the reference voltage. At the same time, P-channel MOSFET $M_7$ is active and creates a high conductivity path to upper power supply voltage $V_{CC}$, thereby causing the output of inverter $INV_2$ to rise to upper power supply voltage $V_{CC}$.

Since transistor $Q_7$ has no collector current when $V_X$ is low, there is no voltage drop across resistor $R_1$ and the input to inverter $INV_1$ is equal to upper power supply voltage $V_{CC}$. When the input to inverter $INV_1$ rises toward upper power supply voltage $V_{CC}$, P-channel MOSFET $M_9$ shuts off and creates a high impedance source-to-drain path to upper power supply voltage $V_{CC}$. At the same time, N-channel MOSFET $M_{10}$ is active and creates a low impedance path to the reference voltage. Thus, the output of inverter $INV_1$ is at the reference voltage.

As discussed above, the output of inverter $INV_1$ is connected to the source of MOSFET $M_5$. When the output of inverter $INV_1$ is at the same reference voltage as the gate of common-gate MOSFET $M_5$, the P-channel of MOSFET $M_5$ is severely constricted at the source, creating a high source-to-drain impedance in MOSFET $M_5$. Thus, the base of transistor $Q_{1A}$, which is at the drain of MOSFET $M_5$, is separated from the reference voltage by a large impedance when $V_X$ is low. At the same time, the high input value of input node $V_Y$ causes transistor $Q_6$ to conduct a collector current nearly equal to the current created by current source $I_{PD1}$. This large collector current, combined with the high source-to-drain impedance of MOSFET $M_5$, causes the voltage at the base of transistor $Q_{1A}$ to drop rapidly. The voltage reduction at the base of transistor $Q_{1A}$ is limited by diode $D_2$, so that the voltage at the base of transistor $Q_{1A}$ does not drop more than approximately 0.7 volts below the saturation reference voltage. By limiting the voltage reduction at the base of transistor $Q_{1A}$, diode $D_2$ is able to keep transistor $Q_6$ from saturating. In other words, the base-collector junction of transistor $Q_6$ never becomes forward biased. In addition, diode $D_2$ keeps transistor $Q_{3A}$ from saturating by limiting the voltage drop at the base of transistor $Q_{1A}$ and thus limiting the voltage drop at the collector of transistor $Q_{3A}$. Thus, diode $D_2$ acts as a saturation control element.

Although diode $D_2$ is shown as a single element, those skilled in the art will recognize that resistors and/or additional diodes may be added or substituted between the saturation reference voltage and the drain of MOSFET $M_5$ to modify the minimum voltage allowed for the base of transistor $Q_{1A}$. In addition, as discussed above, the saturation reference voltage does not have to be the same as the common-gate reference voltage. In fact, if lower power supply voltage $V_{EE}$ is lowered, the saturation reference voltage can be chosen to be much lower than the common-gate reference voltage, as long as it is still high enough, relative to $V_{EE}$ and the input signals, to keep transistors $Q_5$, $Q_6$, $Q_{4A}$, and $Q_{3A}$ from saturating.

The drop in voltage at the base of transistor $Q_{1A}$ causes transistor $Q_{1A}$ to turn off and the high input value on input node $V_Y$ causes transistor $Q_{3A}$ to turn on. With transistor $Q_{1A}$ off and transistor $Q_{3A}$ on, the voltage at the base of transistor $Q_{1A}$ determines the voltage at the terminal of the inductor connected to the emitter of transistor $Q_{1A}$. Specifically, the voltage at $Q_{1A}$'s emitter is equal to the saturation reference voltage minus the diode voltage drop across diode $D_2$ and a minus similar diode voltage drop across transistor $Q_{1A}$.

As discussed above, the output of inverter $INV_2$ is equal to upper power supply voltage $V_{CC}$ when $V_Y$ is high. Since inverter $INV_2$'s output is connected to the source of common-gate MOSFET $M_6$, this high value creates a high conductivity path in MOSFET $M_6$ from upper power supply voltage $V_{CC}$ to the base of transistor $Q_{2A}$. At the same time, the low input value of input node $V_X$ causes transistor $Q_5$ to turn off, thereby keeping transistor $Q_5$ from pulling down the voltage at the base of transistor $Q_{2A}$. Together, the lack of current being pulled from the base of transistor $Q_{2A}$ and the high conductivity path to upper power supply voltage $V_{CC}$, cause the base of transistor $Q_{2A}$ to quickly rise to nearly upper power supply voltage $V_{CC}$, and thereby quickly activate transistor $Q_{2A}$. The low input value of $V_X$ also causes transistor $Q_{4A}$ to turn off. Therefore, with $V_Y$ high and $V_X$ low, transistors $Q_{2A}$ and $Q_{3A}$ conduct nearly all of current $I_{WA}$, and transistors $Q_{1A}$ and $Q_{4A}$ conduct no current.

In this embodiment, the swing voltage of inductor $L_A$ is equal to the voltage at the emitter of transistor $Q_{2A}$ minus the voltage at the emitter of transistor $Q_{1A}$ immediately after transistor $Q_{2A}$ turns on and transistor $Q_{1A}$ turns off. At that instance, the voltage at the emitter of transistor $Q_{2A}$ is equal to upper power supply voltage $V_{CC}$ minus a diode drop across transistor $Q_{2A}$. The voltage at the emitter of transistor $Q_{1A}$ is equal to the saturation reference voltage minus a diode drop across diode $D_2$ and minus another diode drop across transistor $Q_{1A}$. Thus, the voltage swing is equal to $V_{CC}$ minus the saturation reference voltage plus a voltage drop across diode $D_2$.

When the input values are reversed, with $V_X$ higher than $V_Y$, the circuit operates in a complimentary manner resulting in transistors $Q_{1A}$ and $Q_{4A}$ conducting nearly all of the current from current source $I_{WA}$ and transistors $Q_{2A}$ and $Q_{3A}$ conducting no current.

An important feature of the present invention is that the sources and drains of MOSFET $M_5$ and $M_6$ have voltages that increase and decrease together. In fact, the source and drain voltages will not be more than about 2.5 volts apart during switching if the respective source node capacitances and drain node capacitances are approximately equal. Thus, when the output of inverter $INV_2$ rises to upper power supply voltage $V_{CC}$, the common-gate configuration of MOSFET $M_6$ causes it to turn on, thereby creating a low impedance pathway to the drain of MOSFET $M_6$. With the complimentary turning off of transistor $Q_5$, this allows the drain voltage of MOSFET $M_6$ to increase with the source voltage to nearly $V_{CC}$. Similarly, when the output of inverter $INV_1$ drops to the reference voltage, thereby lowering the voltage at the source of MOSFET $M_5$, transistor $Q_6$ turns on and causes the voltage at the drain of MOSFET $M_5$ to decrease until it reaches a value equal to the saturation reference voltage minus the voltage drop across diode $D_2$. Because the source and drain voltages track together in both MOSFET $M_5$ and MOSFET $M_6$, the MOSFETs are less likely to experience a breakdown voltage between their sources and drains. This is notable since inductor $L_A$ still experiences a swing voltage greater than $V_{CC}$ minus the saturation reference voltage, and this swing voltage is typically greater than the breakdown voltage of the MOSFETs. Thus, in the present invention, the swing voltage for the inductor is independent of the breakdown voltage of the MOSFETs in the first pre-driver stage.

It is also notable that the maximum source-to-drain voltage seen by the MOSFETs in the inverters is less than the swing voltage across the inductor. The maximum source-to-drain voltage seen by an inverter MOSFET in the present invention is $V_{CC}$ minus the common-gate reference voltage. However, the swing voltage is $V_{CC}$ minus the saturation reference voltage plus at least one diode voltage drop. Thus, even if the saturation reference voltage is chosen to be the same as the common-gate reference voltage, as shown in FIG. 2, the swing voltage can be greater than the voltage across the inverter MOSFETs. In fact, if the saturation reference voltage is much lower than the common-gate reference voltage, the swing voltage can be much larger than the breakdown voltage. Thus, the swing voltage is not limited by MOSFET breakdown voltages in the present invention.

Figure 3:
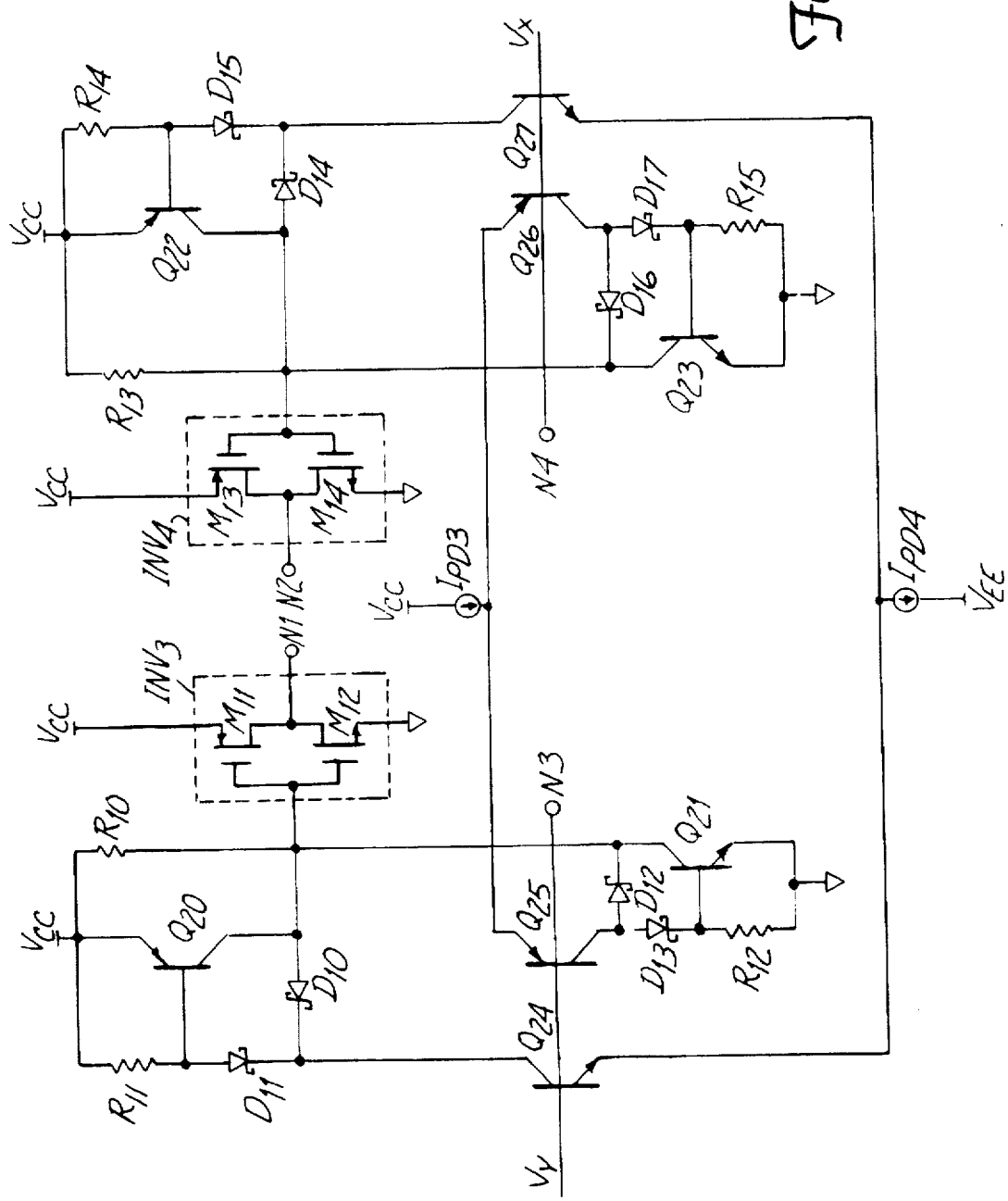
FIG. 3 is a detailed diagram of a second embodiment of a second pre-driver stage for the present invention.

FIG. 3 shows a second embodiment of the second pre-driver stage of FIG. 2. For simplicity, the first pre-driver stage and the H-switch have been removed. To implement this second pre-driver stage with the first pre-driver stage and switching stage of FIG. 2, node N1 of FIG. 3 would be connected to the source of MOSFET $M_6$ of FIG. 2, node N2 would be connected to the source of MOSFET $M_5$, node N3 would be connected to the bases of transistors $Q_6$ and $Q_{3A}$, and node N4 would be connected to the bases of transistors $Q_5$ and $Q_{4A}$. Of course, the second pre-driver stage of FIG. 3 would replace the second pre-driver stage of FIG. 2, which means replacing inverters $INV_1$ and $INV_2$, resistors $R_1$ and $R_2$, transistors $Q_7$ and $Q_8$, and current source $I_{PD2}$.

MOSFETs $M_{11}$ and $M_{12}$ form an inverter $INV_3$. The drains and gates of MOSFETs $M_{11}$ and $M_{12}$ are connected together, with the drains forming an inverter output, and the gates forming an inverter input. The source of P-channel MOSFET $M_{11}$ is connected to upper power supply voltage $V_{CC}$, and the source of N-channel MOSFET $M_{12}$ is connected to the same reference voltage connected to the gates of the common-gate MOSFETs in the first pre-driver stage of FIG. 2.

The input to inverter $INV_3$ is connected to circuit elements that quickly change the voltage level at the inverter input. Transistors $Q_{20}$ and $Q_{24}$, resistor $R_{11}$, and diodes $D_{10}$ and $D_{11}$ quickly raise the input voltage of inverter $INV_3$ when input $V_Y$ is high. Transistors $Q_{21}$ and $Q_{25}$, resistors $R_{10}$ and $R_{12}$, and diodes $D_{12}$ and $D_{13}$, operate to lower the input voltage of inverter $INV_3$ when input $V_Y$ is low.

Transistor $Q_{20}$ is a PNP transistor with its collector connected to the input of inverter $INV_3$, its emitter connected to upper power supply voltage $V_{CC}$, and its base connected to the anode of diode $D_{11}$ and one terminal of resistor $R_{11}$. The other terminal of resistor $R_{11}$ is connected to upper power supply voltage $V_{CC}$. Resistor $R_{10}$ is connected between the emitter and the collector of transistor $Q_{20}$. Diode $D_{10}$ has its anode connected to the collector of transistor $Q_{20}$ and its cathode connected to the cathode of diode $D_{11}$ and the collector of NPN transistor $Q_{24}$. The base of transistor $Q_{24}$ is connected to input $V_Y$ and the emitter of transistor $Q_{24}$ is connected to current source $I_{PD4}$, which has a second terminal connected to lower power supply voltage $V_{EE}$.

The input to inverter $INV_3$ is also connected to the collector of NPN transistor $Q_{21}$, which has its emitter connected to the reference voltage, and its base connected to one terminal of resistor $R_{12}$ and the cathode of diode $D_{13}$. The other terminal of resistor $R_{12}$ is connected to the reference voltage. The cathode of diode $D_{12}$ is connected to the collector of transistor $Q_{21}$, and the anode of diode $D_{12}$ is connected to the anode of diode $D_{13}$ and the collector of PNP transistor $Q_{25}$. The base of transistor $Q_{25}$ is connected to input $V_Y$, and the emitter of transistor $Q_{25}$ is connected to current source $I_{PD3}$, which has a second terminal connected to upper power supply voltage $V_{CC}$.

In operation, when $V_Y$ is high, transistor $Q_{25}$ is inactive and prevents current flow in its collector. Since transistor $Q_{25}$'s collector is the only source of current for resistor $R_{12}$, transistor $Q_{25}$ prevents current from flowing through resistor $R_{12}$. With no current flowing through resistor $R_{12}$, the base of transistor $Q_{21}$ is at the same voltage as the emitter of transistor $Q_{21}$, and transistor $Q_{21}$ is inactive. Since transistor $Q_{21}$ does not conduct a current at its collector when it is inactive, transistor $Q_{21}$, along with diode $D_{12}$, create an extremely high impedance between inverter $INV_3$'s input and lower power supply voltage $V_{EE}$.

While transistor $Q_{25}$ is inactive, transistor $Q_{24}$ is active. The active collector current of transistor $Q_{24}$ is partially drawn through resistor $R_{11}$, causing a voltage drop at the base of transistor $Q_{20}$. This voltage drop activates transistor $Q_{20}$ and causes it to act as a low impedance bypass to resistor $R_{10}$. This low impedance path quickly raises the voltage at the gate of inverter $INV_3$ to $V_{CC}$ minus the base-emitter voltage of transistor $Q_{20}$. Diodes $D_{11}$ and $D_{10}$ prevent the voltage from increasing beyond this point. When the voltage is high enough, P-channel MOSFET $M_{11}$ stops conducting a source-to-drain current and N-channel MOSFET $M_{12}$ begins to conduct a source-to-drain current. The open channel of MOSFET $M_{12}$ thereby lowers the voltage at Node N1 to the reference voltage.

When input $V_Y$ is low, transistor $Q_{24}$ is inactive. Since transistor $Q_{24}$ has no collector current when it is inactive, no current flows through resistor $R_{11}$ and the voltage at the base of transistor $Q_{20}$ is the same as the voltage at the emitter of transistor $Q_{20}$. Thus transistor $Q_{20}$ is inactive and has no collector current. Further, diode $D_{10}$ is reversed biased so there is no current flowing through diode $D_{10}$.

With $V_Y$ low, transistor Q25 is active and a portion of the active collector current of transistor $Q_{25}$ passes through resistor $R_{12}$ creating sufficient voltage to turn on transistor $Q_{21}$. The active collector current of transistor $Q_{21}$ is drawn through resistor $R_{10}$ and creates a voltage drop across resistor $R_{10}$ resulting in a low voltage at the input to inverter $INV_3$. The voltage at the input to inverter $INV_3$ is prevented from dropping too low by diodes $D_{12}$ and $D_{13}$, which prevent the voltage from dropping below the reference voltage plus the base-emitter voltage of transistor $Q_{21}$. The low inverter input voltage causes N-channel MOSFET $M_{12}$ to turn off and creates a high conductivity source-to-drain path in P-channel MOSFET $M_{11}$ between upper power supply voltage $V_{CC}$ and node N1. This raises the voltage at node N1 to approximately upper power supply voltage $V_{CC}$.

Inverter $INV_4$ is constructed from P-channel MOSFET $M_{13}$ and N-channel MOSFET $M_{14}$, which have their drains connected together to form an inverter output and their gates connected together to form an inverter input. The source of MOSFET $M_{13}$ is connected to upper power supply voltage $V_{CC}$ and the source of MOSFET $M_{14}$ is connected to the reference voltage. The input of inverter $INV_4$ is connected to a circuit that is the compliment of the circuit connected to the input of inverter $INV_3$.

Transistors $Q_{22}$ and $Q_{27}$, resistor $R_{14}$, and diodes $D_{14}$ and $D_{15}$ operate to increase the voltage at the inverter's input when input $V_X$ is high. Transistor $Q_{22}$ is a PNP transistor with its collector connected to the input of inverter $INV_4$, its emitter connected to upper power supply voltage $V_{CC}$ and its base connected between one terminal of resistor $R_{14}$ and the anode of diode $D_{15}$. The other terminal resistor $R_{14}$ is connected to upper power supply $V_{CC}$. Diode $D_{14}$ has its anode connected to the collector of transistor $Q_{22}$ and its cathode connected to the cathode of diode $D_{15}$ and the collector of NPN transistor $Q_{27}$. Transistor $Q_{27}$ has its emitter connected to current source $I_{PD4}$ and its base connected to input $V_X$.

Transistors $Q_{26}$ and $Q_{23}$, resistors $R_{13}$ and $R_{15}$, and diodes $D_{16}$ and $D_{17}$, operate to lower the input voltage of inverter $INV_4$ when input $V_X$ is low. Transistor $Q_{23}$ is an NPN transistor with its emitter connected to the reference voltage, its collector connected to inverter $INV_4$'s input, and its base connected to one terminal of resistor $R_{15}$ and the cathode of diode $D_{17}$. The other terminal of resistor $R_{15}$ is connected to the reference voltage. Diode $D_{16}$ has its cathode connected to the input of inverter $INV_4$, and its anode connected to the anode of diode $D_{17}$ and to the collector of PNP transistor $Q_{26}$. The base of transistor $Q_{26}$ is connected to input $V_X$, and the emitter of transistor $Q_{26}$ is connected to current source $I_{PD3}$. Resistor $R_{13}$ is connected between the emitter and collector of transistor $Q_{22}$.

Inverter $INV_4$ and the associated circuitry used to raise and lower the input voltage of the inverter, operate in a manner identical to that explained above for inverter $INV_3$ and its accompanying circuitry. The only difference is that inverter $INV_4$ is driven by input $V_X$ instead of $V_Y$. Since $V_Y$ and $V_X$ are differential inputs, the outputs of inverters $INV_3$ and $INV_4$ will not be the same in steady state. When one output is at upper power supply voltage $V_{CC}$, the other will be at the reference voltage.

Although the present invention has been described with reference to preferred embodiments, workers skilled in the art will recognize that changes may be made in form and detail without departing from the spirit and scope of the invention.

What is claimed is:

1. An apparatus for conducting current through a two-terminal inductive load, the apparatus comprising:

a first conduction path having first and second ends, the first end for coupling to a first supply voltage, the second end for coupling to a first terminal of the inductive load, the first conduction path comprising a first switching device, the first switching device for controlling the current in the first conduction path;

a second conduction path having first and second ends, the first end for coupling to a second supply voltage, the second end for coupling to a second terminal of the inductive load;

a pre-driver field-effect transistor, having a gate terminal, second terminal and third terminal, the gate terminal coupled to a common-gate reference voltage, the second terminal coupled to a node having a time varying voltage, and the third terminal coupled to the first switching device, the voltage at the third terminal capable of increasing when the voltage at the second terminal increases, the pre-driver field-effect transistor for controlling the first switching device based upon the time varying voltage.

2. The apparatus of claim 1 further comprising an inverter having a first terminal, second terminal, third terminal and fourth terminal, the first terminal coupled to the first supply voltage, the second terminal coupled to the common-gate reference voltage and the third terminal coupled to the second terminal of the pre-driver field-effect transistor.

3. The apparatus of claim 2 wherein the inverter and the pre-driver field-effect transistor are capable of providing a low impedance path from the first supply voltage to the third terminal of the pre-driver field-effect transistor to reduce the voltage difference between the voltage of the third terminal of the pre-driver field effect transistor and the first supply voltage.

4. The apparatus of claim 2 wherein the inverter is capable of providing a low impedance path from the common-gate reference voltage to the second terminal of the pre-driver field-effect transistor while the pre-driver field-effect transistor is providing a high impedance path from its second terminal to its third terminal to increase the voltage difference between the voltage of the third terminal of the pre-driver field-effect transistor and the first supply voltage.

5. The apparatus of claim 2 wherein the inverter comprises an inverter field-effect transistor with a breakdown voltage and wherein the inductive load has a maximum swing voltage that is greater than the breakdown voltage of the inverter field-effect transistor.

6. The apparatus of claim 1 further comprising:

a third conduction path having first and second ends, the first end for coupling to the first power supply voltage, the second end for coupling to the second terminal of the inductive load; and a fourth conduction path having first and second ends, the first end for coupling to the second supply voltage, the second end for coupling to the first terminal of the inductive load, the fourth conduction path comprising a second switching device.

7. The apparatus of claim 6 further comprising a pre-driver transistor having a first terminal, a second terminal, and a third terminal, the first terminal coupled to the third terminal of the pre-driver field-effect transistor, and the second terminal coupled to the second switching device.

8. The apparatus of claim 7 wherein the pre-driver transistor operates in an active region when the pre-driver field-effect transistor has a high impedance from its second terminal to its third terminal.

9. The apparatus of claim 7 further comprising a saturation controller coupled to a saturation reference voltage and the first terminal of the pre-driver transistor, the saturation controller limiting the saturation of the second switching device.

10. An apparatus for conducting current through an inductive element, the apparatus comprising:

a switching stage, for coupling to the inductive element and for conducting all of the current conducted through the inductive element, the switching stage coupled between a first reference voltage and a second reference voltage;

a first pre-driver stage, coupled to the switching stage, the first pre-driver stage for partially controlling the currents conducted by the switching stage, the first pre-driver stage also for conducting first pre-driver currents;

a second pre-driver stage, coupled to the first pre-driver stage, the second pre-driver stage for partially controlling the first pre-driver currents in response to input signals, the second pre-driver stage comprising an inverter, the inverter coupled between the first reference voltage and a third reference voltage, the third reference voltage intermediate of the first and second reference voltages.

11. The apparatus of claim 10 wherein the switching stage comprises a first switching transistor for coupling between the inductive element and the first reference voltage, the first switching transistor having a first current and the first switching transistor controllable by the first pre-driver stage.

12. The apparatus of claim 11 wherein the first pre-driver stage comprises a first pre-drive transistor, the first pre-drive transistor being a field-effect transistor having a first terminal coupled to the third reference voltage, a second terminal coupled to the inverter of the second pre-driver stage and a third terminal coupled to the first switching transistor.

13. The apparatus of claim 12 wherein the first pre-driver stage further comprises a second pre-drive transistor, the second pre-drive transistor having a first terminal coupled to the first switching transistor and a second terminal coupled to an input node to receive an input signal.

14. The apparatus of claim 13 wherein the inverter and first pre-drive transistor together are capable of providing a high impedance conduction path from the first switching transistor to the third reference voltage when the second pre-drive transistor is in active operation.

15. The apparatus of claim 13 wherein the inverter and first pre-drive transistor together are capable of providing a low impedance conduction path from the first switching transistor to the first reference voltage when the second pre-drive transistor is in an inactive range of operation.

16. The apparatus of claim 13 wherein the first pre-drive stage further comprises a saturation control element coupled to the first switching transistor to limit the saturation of the second pre-drive transistor.

17. The apparatus of claim 16 wherein the saturation control element is a diode coupled between the first switching transistor and a fourth reference voltage.

18. The apparatus of claim 10 wherein the inverter comprises a first inverter field-effect transistor and a second inverter field-effect transistor.

19. An apparatus for driving current through a two-terminal inductive load, the apparatus comprising:

a switching circuit, having at least one switching device coupled to a terminal of the inductive load, the switching circuit for directing current through the inductive load in response to input signals, the switching circuit coupled between a first voltage source and a second voltage source;

a first pre-driver circuit, having a field-effect transistor coupled to a switching device of the switching circuit, the first pre-driver circuit for controlling a portion of the switching circuit; and a second pre-driver circuit, having an inverter coupled to the first pre-driver circuit, the inverter for applying a voltage to the field-effect transistor of the first pre-driver circuit in response to an input signal, the inverter coupled between the first voltage source and a third voltage source, the third voltage source different from the second voltage source.

20. The apparatus of claim 19 further comprising a saturation control element coupled to the first pre-driver circuit and the switching circuit to limit the saturation of active elements.

* * * * *